United States Patent
Wyse

(10) Patent No.: US 9,240,815 B1
(45) Date of Patent: Jan. 19, 2016

(54) RECONFIGURABLE FILTER

(71) Applicant: Russell D. Wyse, Center Point, IA (US)

(72) Inventor: Russell D. Wyse, Center Point, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 0 days.

(21) Appl. No.: 14/224,699

(22) Filed: Mar. 25, 2014

(51) Int. Cl.
| | |
|---|---|
| *H03H 7/12* | (2006.01) |
| *H03H 7/01* | (2006.01) |
| *H04B 1/10* | (2006.01) |
| *H03H 7/21* | (2006.01) |
| *H03H 9/70* | (2006.01) |

(52) U.S. Cl.
CPC .............. *H04B 1/1036* (2013.01); *H03H 7/01* (2013.01); *H03H 7/0161* (2013.01); *H03H 7/12* (2013.01); *H03H 7/21* (2013.01); *H03H 9/70* (2013.01); *H03H 2007/013* (2013.01)

(58) Field of Classification Search
CPC ..... H03H 7/0115; H03H 9/70; H03H 7/0153; H03H 7/01; H03H 7/12; H03H 2007/0013; H03H 7/0161; H04B 1/1036
USPC .................................. 333/132, 172, 174, 175
See application file for complete search history.

(56) References Cited

U.S. PATENT DOCUMENTS

| | | | | |
|---|---|---|---|---|
| 5,570,350 | A * | 10/1996 | Myer et al. ..................... | 370/335 |
| 5,612,975 | A * | 3/1997 | Becker et al. .................. | 375/319 |
| 5,694,396 | A * | 12/1997 | Firouzbakht et al. .......... | 370/480 |
| 5,789,996 | A * | 8/1998 | Borodulin ..................... | 333/117 |
| 2008/0164939 | A1* | 7/2008 | Lin et al. ....................... | 327/554 |
| 2010/0233984 | A1* | 9/2010 | Yang et al. .................... | 455/307 |
| 2011/0169589 | A1 | 7/2011 | Franzon et al. | |

OTHER PUBLICATIONS

U.S. Appl. No. 14/030,411, filed Sep. 18, 2013 "Multiple Mode RF Circuit".
U.S. Appl. No. 13/714,209, filed Dec. 13, 2012 "Ultra-Precision Linear Phase Shifter With Gain Control".

* cited by examiner

*Primary Examiner* — Benny Lee
*Assistant Examiner* — Rakesh Patel
(74) *Attorney, Agent, or Firm* — Angel Gerdzhikov; Donna Suchy; Daniel Barbieri

(57) ABSTRACT

A reconfigurable filter includes a splitter for providing an input signal on a plurality of paths. A first path includes a first filter section that can be configured as either a tunable band pass filter with a shunt-connected fixed inductor or a tunable notch filter with a fixed inductor in parallel with a tunable varactor, either of which can be responsive to a control signal. A second path is an all pass section that provides an unfiltered signal. A combiner is provided for combining the first filtered signal with the unfiltered signal for producing a composite signal. The unfiltered signal can have its gain or phase modified in either or both the splitter or the combiner.

15 Claims, 12 Drawing Sheets

RECONFIGURABLE FILTER

This applicant incorporates by reference U.S. non-provisional patent application titled, "MULTIPLE MODE RF CIRCUIT," Ser. No. 14/030,411, filed on Sep. 18, 2013, now U.S. Pat. No. 8,963,612, issued Feb. 24, 2015, and U.S. non-provisional patent application titled, "ULTRA-PRECISION LINEAR PHASE SHIFTER WITH GAIN CONTROL," Ser. No. 13/714,209, filed on Dec. 13, 2012. The entirety of both applications are incorporated by reference herein.

BACKGROUND

This disclosure relates to filters, and more specifically to wideband, programmable, and electronically reconfigurable filters.

Filters play an important role in electronic communication. Filters can be used to suppress noise and interference, as well as condition signals for transmission. Many types of filters can be found in communication systems, including passive filters for high-power signals in antenna systems and digital filters for low-power signals in demodulation and decoding circuitry. Filters can be uniquely designed and tailored for each application.

SUMMARY

A reconfigurable filter is disclosed that includes a splitter for providing an input signal on a plurality of paths. A first path includes a first filter section that can be configured as either a tunable band pass filter with a shunt-connected fixed inductor or a tunable notch filter with a fixed inductor in parallel with a tunable varactor, either of which can be responsive to a control signal. A second path is an all pass section that provides an unfiltered signal. A combiner is provided for combining the first filtered signal with the unfiltered signal for producing a composite signal. The unfiltered signal can have its gain or phase modified in either or both the splitter or the combiner.

The reconfigurable filter can be combined in various parallel and series combinations to create virtually any type of filter with an infinite variety of frequency responses. In one embodiment, the reconfigurable filters are used in a method for cancelling a signal. The method includes receiving an input signal that includes a signal of interest and an undesired signal. The method continues by creating a synthesized signal that is phase-shifted with respect to the undesired signal. Thereafter, the synthesized signal is combined with the input signal to substantially cancel the undesired signal with respect to the signal of interest.

These and other aspects, features, and advantages of the invention will become apparent upon review of the following description taken in connection with the accompanying drawings. The invention, though, is pointed out with particularity by the appended claims.

DESCRIPTION OF ILLUSTRATIVE EMBODIMENTS

Figure 1:
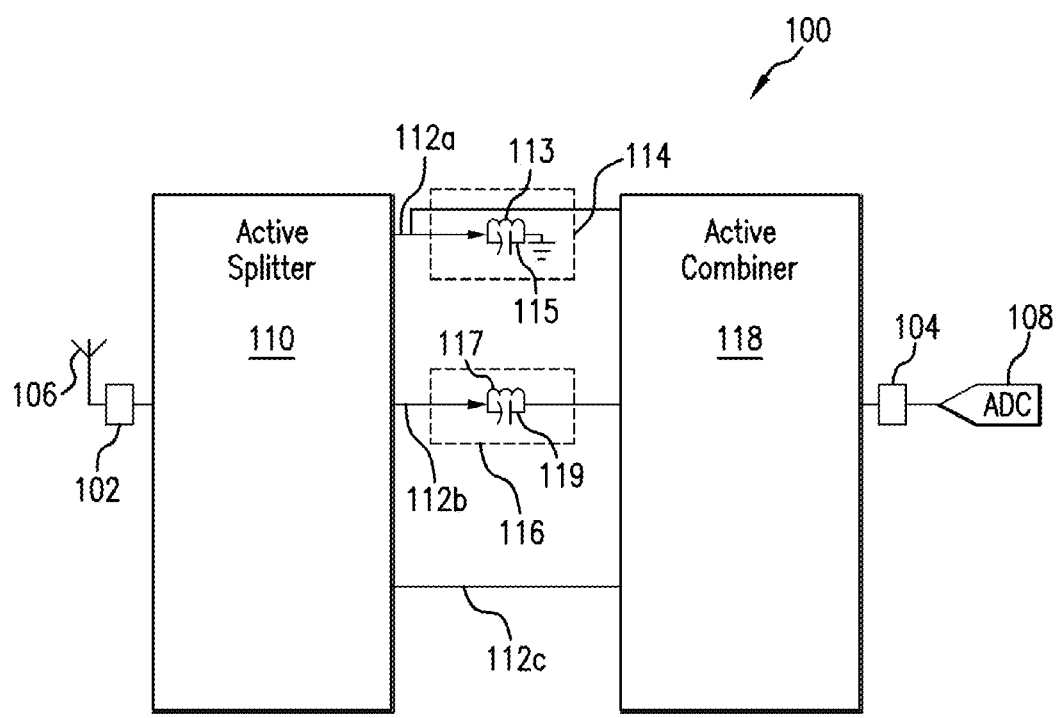
FIG. 1 is a block diagram of a reconfigurable filter.

FIG. 1 shows an embodiment of a reconfigurable filter 100. Reconfigurable filter 100 can be implemented as a unit cell alone, or in series or parallel combination with multiple reconfigurable filters 100. Reconfigurable filter 100 includes an input port 102 and an output port 104. Input port 102 can be connected to an antenna 106 or any other analog signal source 106. Output port 104 can be connected to an analog to digital converter (ADC) 108 or any other signal processing component 108 or other reconfigurable filters 100 or any other RF component. One skilled in the art will recognize that while reconfigurable filter 100 is shown with single-ended connections, differential connections for one or more or all input and output connections are contemplated.

An input signal received at input port 102 is provided to an active splitter 110 where the input signal can be split into a plurality of paths 112a, 112b and 112c. While the illustrated embodiment shows only three paths 112a, 112b and 112c, one skilled in the art would recognize fewer paths can be provided or multiple n-paths can be provided depending upon the desired signal processing application. The signal on paths 112a, 112b and 112c can be substantially equivalent to or the same as the input signal received at input port 102 or the input signal provided to each path 112a, 112b and 112c can have their gain and phase independently modified to provide a first modified input signal, a second modified input signal, and a third modified input signal for paths 112a, 112b and 112c, respectively. The manner in which active splitter 110 modifies the input signal received from input port 102 is discussed more thoroughly below.

In the illustrated embodiment, the signal on path 112a from active splitter 110 is received by a first filter section 114. First filter section 114 is operably responsive to a control signal to change a frequency response of first filter section 114. First filter section can be a tunable band pass filter 114 with a shunt-connected fixed inductor (L) 113 combined in parallel with a tunable varactor (C) 115 responsive to the control signal. Tunable band pass filter 114 can also be implemented with activated passive components as taught in U.S. Pat. No. 8,497,730, the contents of which are hereby incorporated by reference in its entirety. The output of first filter section 114 is a first filtered signal.

Figure 2:
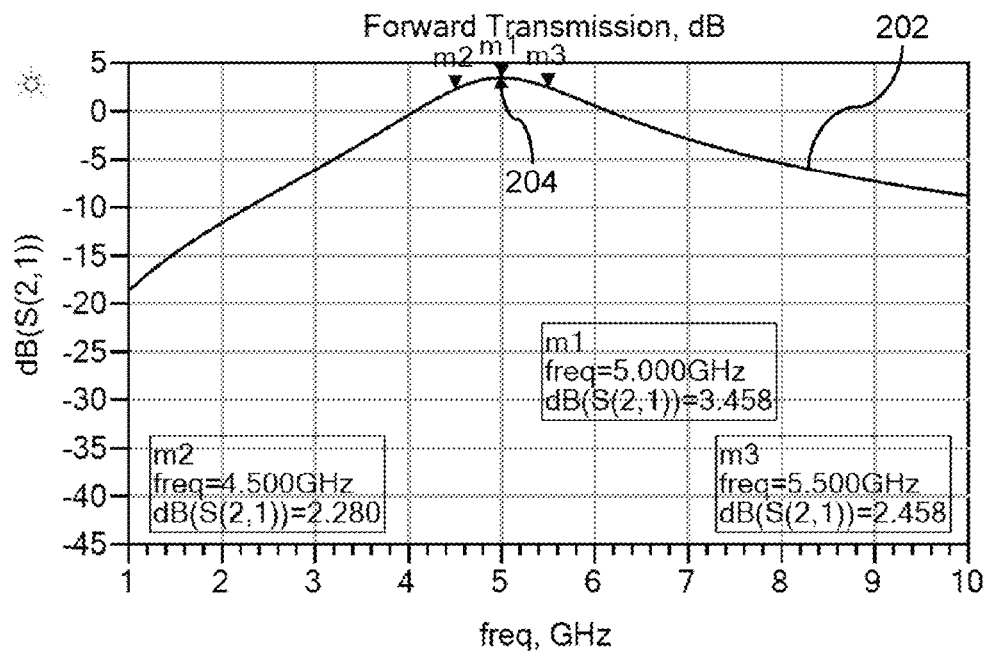
FIG. 2 is a plot of a 5 GHz band pass response of a first filter section of the reconfigurable filter of FIG. 1.

FIG. 2 shows a plot of the band pass response with path 112a activated with first filter section 114 of reconfigurable filter 100 tuned to 5 GHz, and paths 112b and 112c off or isolated. Line 202 shows how the center frequency at 5 GHz at peak 204 (also referred to as a pole) decreases in decibels the further the signal is from the center frequency.

FIG. 1 shows the signal on path 112b from active splitter 110 is received by a second filter section 116. Second filter section 116 is operable responsive to a control signal to change a frequency response of second filter section 116. Second filter section can be a tunable notch filter 116 with a fixed inductor (L) 117 combined in parallel with a tunable varactor (C) 119 responsive to the control signal. Tunable notch filter 116 can be implemented with activated passive components as taught in U.S. Pat. No. 8,497,730, supra. The output of second filter section 116 is a second filtered signal.

Figure 3:
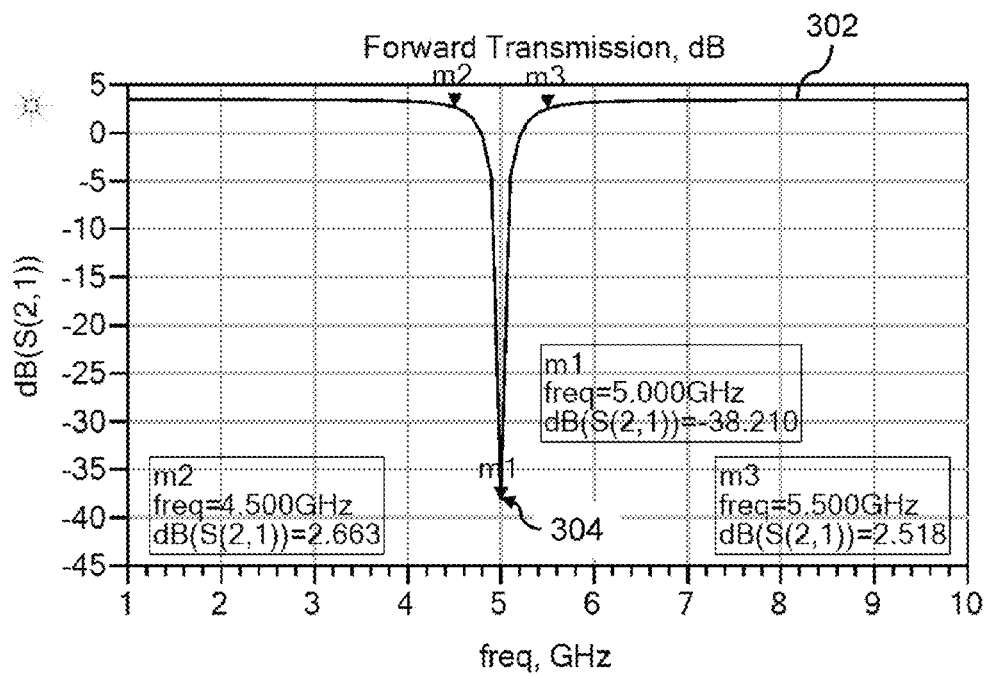
FIG. 3 is a plot of a 5 GHz notch response of a second filter section of the reconfigurable filter of FIG. 1.

FIG. 3 shows a plot of a notch filter response with path 112b activated with second filter section 116 of reconfigurable filter 100 tuned to 5 GHz, and paths 112a and 112c off or isolated. Line 302 shows how the center frequency at 5 GHz at low point 304 (also referred to as a zero) increases in decibels the further the signal is from the center frequency.

FIG. 1 shows the signal on path 112c from active splitter 110 is provided straight to an active combiner 118. Path 112c is considered the all pass section, and the signal from the all pass section allows an unfiltered signal from active splitter 110 to be provided to active combiner 118. The unfiltered signal could have its gain or phase modified in one or both of active splitter 110 and active combiner 118.

Figure 4:
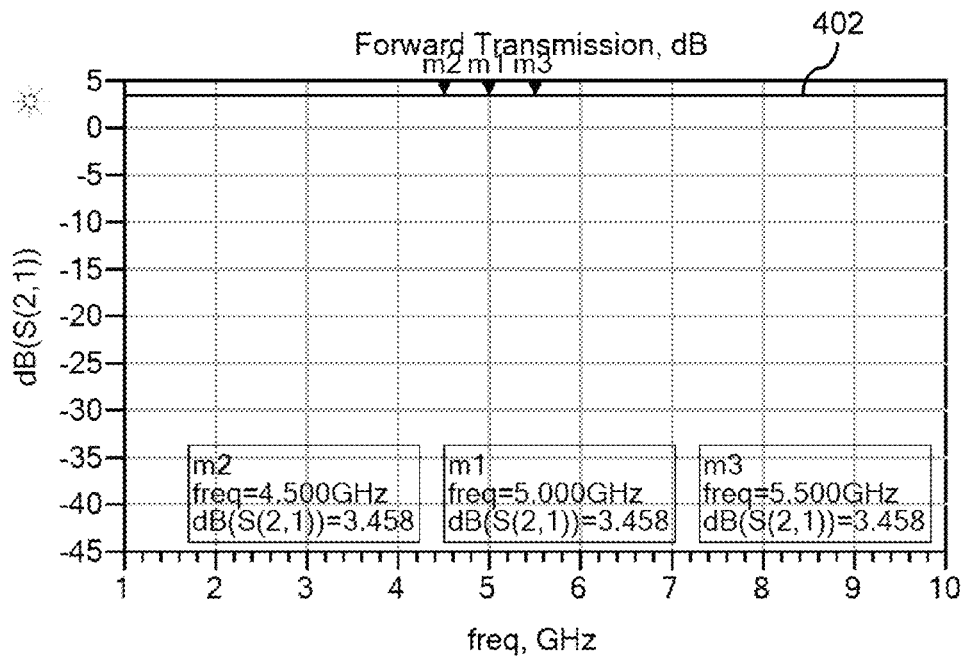
FIG. 4 is a plot of an all-pass pass band response of a 5 GHz input signal.

FIG. 4 shows a plot of an all-pass response of reconfigurable filter 100 with path 112c activated and paths 112a and 112b off or isolated. Line 402 shows no reduction in decibels across the frequency range of the input signal.

Figure 5:
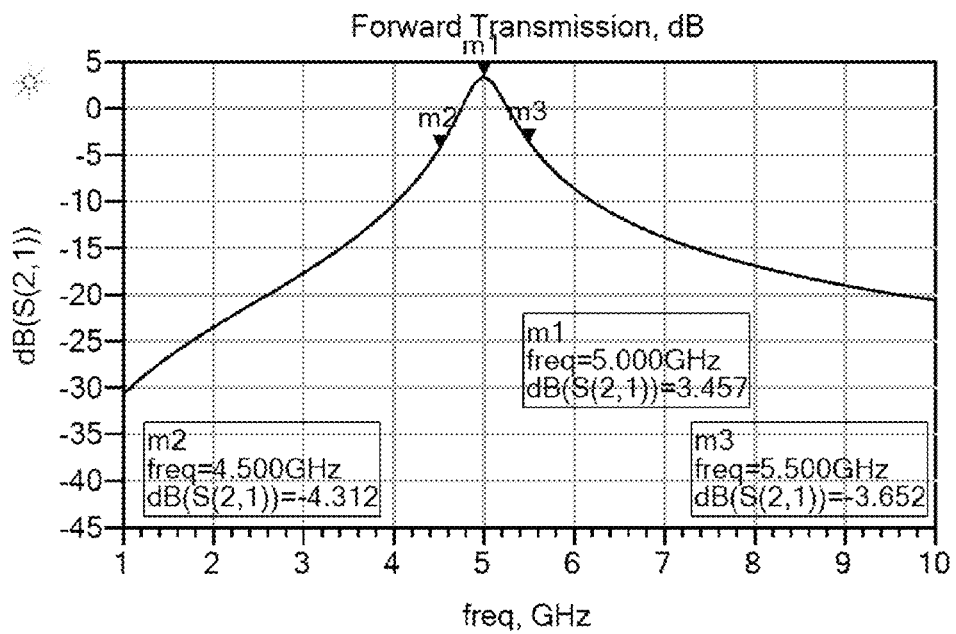
FIG. 5 is a plot of a 5 GHz band pass response of the reconfigurable filter having the notch filter of the second filter section combined with the all pass filter section and a phase adjustment of 180 degrees.

FIG. 1 shows active combiner 118 operable for combining the first filtered signal from first filter section 114, second filtered signal from second filter section 116, and the input signal on third path 112c in any manner to achieve the desired filter characteristics. One or more paths 112a, 112b and 112c can be combined to each other or have their respective gain and phase shifted. For example, FIG. 5 shows a plot of a combination of the pass band response of a notch filter section 116 on path 112b tuned to 5 GHz, combined with an all pass filter section on path 112c tuned to be 180 degrees out of phase to produce a band pass filter response tuned to a center frequency of 5 GHz and a sharp drop to the cutoff frequencies (i.e. −3 dB of each side of the center frequency). Away from the notch center frequency, the impedance of the notch filter section 116 is much greater than the RF interface impedances of the interconnecting active circuits, such as active splitter 110 or active combiner 118, or any other active devices connected to reconfigurable filter 100, so there is no appreciable impact on the phase or the amplitude of the signal by such devices. This leads to the cancelling of an amplitude response away from the notch center frequency because the two paths, path 112b and 112c, are essentially equal and 180 degrees out of phase so that the signals cancel.

Figure 6:
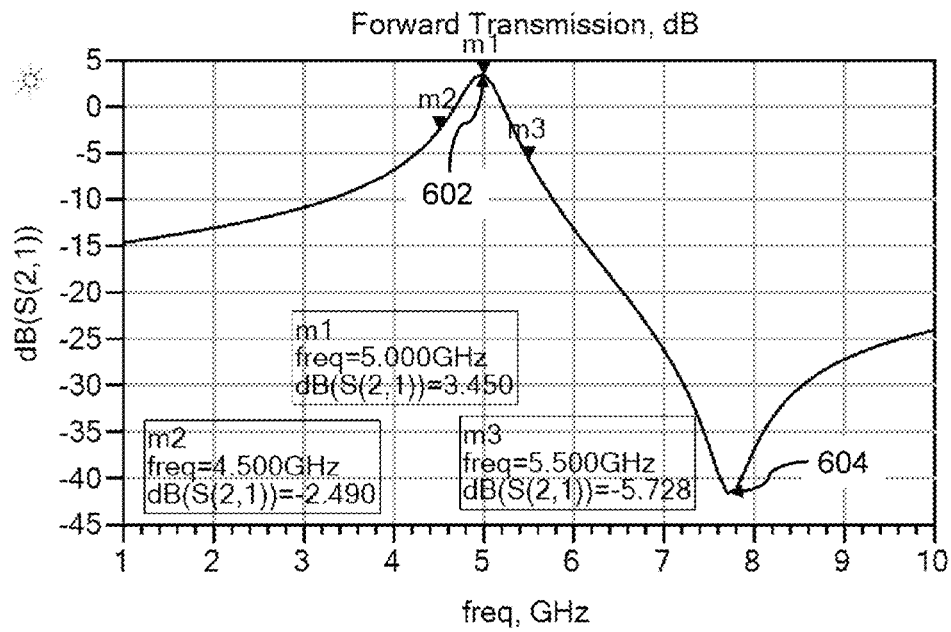
FIG. 6 is a plot of the 5 GHz band pass response of the reconfigurable filter having the all pass filter section modified with a phase adjustment of slightly more than 180 degrees.

The output of reconfigurable filter 100 can be modified to create more complex band-pass and band stop filtering. FIG. 6 shows a plot of the pass band response of the filter combination shown in FIG. 5, but with the all pass response of path 112c shifted approximately 187 degrees out of phase to reconfigure a notch response closer to the pass band center frequency for cases where a stronger rejection is desired at 7.7 GHz, for example. A center frequency of 5 GHz at peak 602 for a band pass and a notch frequency of about 7.7 GHz at low point 604.

Figure 7:
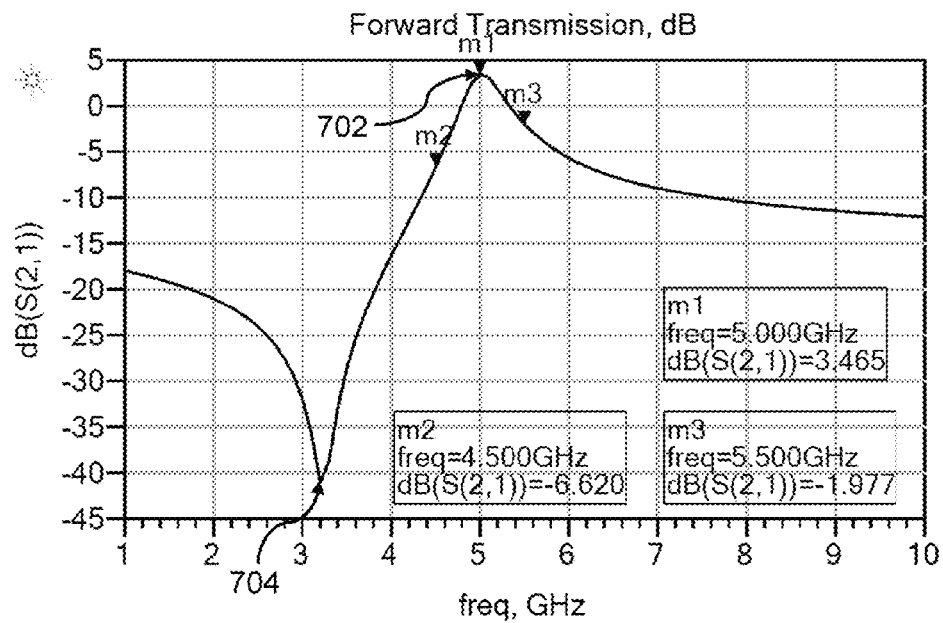
FIG. 7 is a plot of the 5 GHz band pass response of the reconfigurable filter having the all pass filter section modified with a phase adjustment of slightly less than 180 degrees.

FIG. 7 shows a plot of the pass band response of the filter combination shown in FIG. 5, but with the all pass response of path 112c shifted approximately 172 degrees out of phase to reconfigure a notch response closer to the pass band center frequency for cases where a stronger rejection is desired at 3.2 GHz, for example. A center frequency of 5 GHz at peak 702 for a band pass and a center frequency of about 3.2 GHz at low point 704. This is done by shifting the phase of the signal on path 112c. More complex filtering capabilities of reconfigurable filter 100 can be found by changing the gain and phase of the signals on one or more paths 112a, 112b, and 112c and tuning first filter section 114 and second filter section 116.

Figure 8:
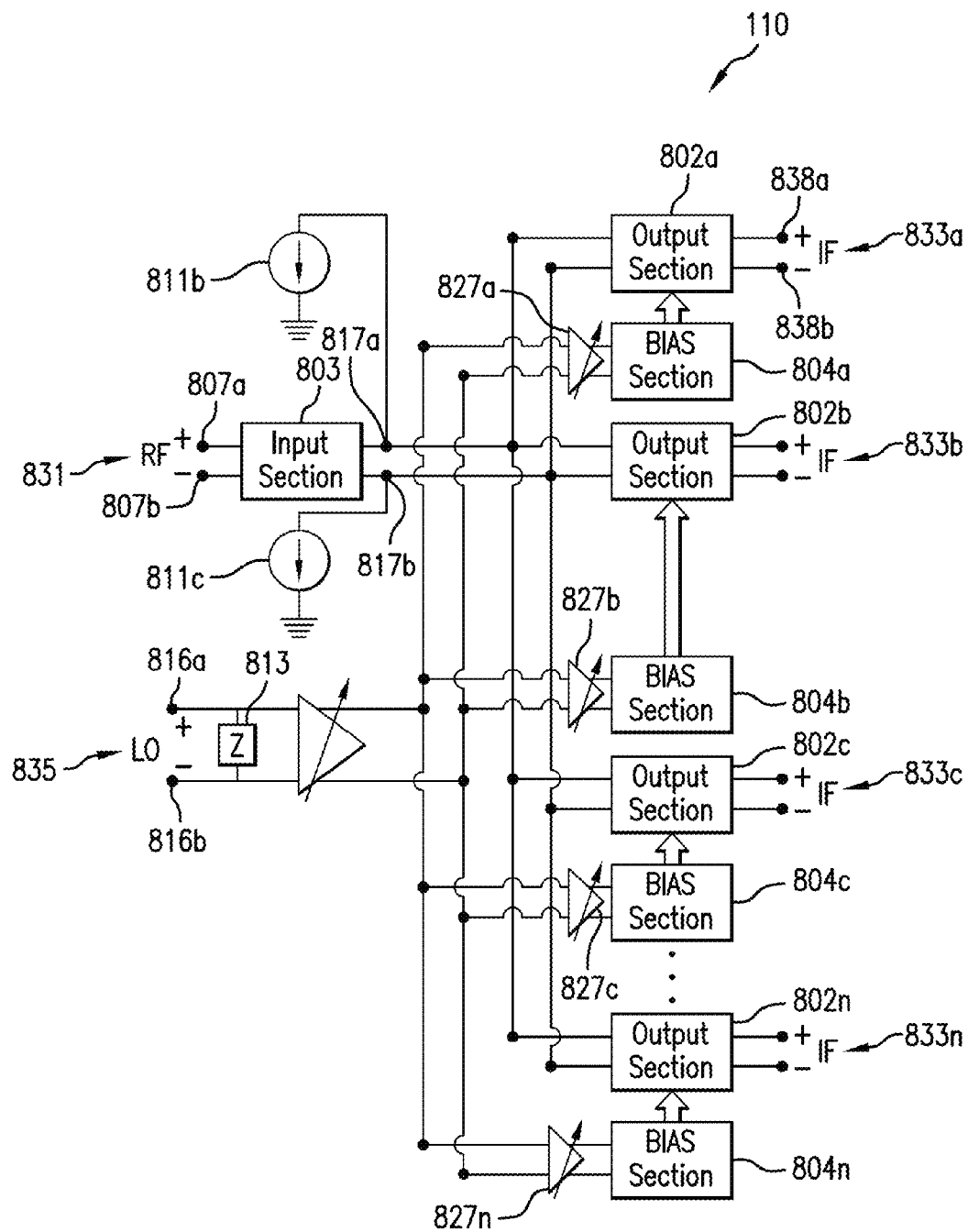
FIG. 8 is a schematic diagram of a multi-mode circuit found in the active splitter of the reconfigurable filter of FIG. 1.

There may be many circuit arrangements suitable for providing the signal modification requirements for active splitter 110 and active combiner 118. One particularly useful circuit arrangement for active splitter 110 can be found in U.S. non-provisional patent application titled, "MULTIPLE MODE RF CIRCUIT," Ser. No. 14/030,411, filed on Sep. 18, 2013, the contents of which are hereby incorporated by reference in its entirety. FIG. 8 shows active splitter 110 with an input section 803 connected to multiple output sections 802a-n. Nodes 817a,b, which provide the first stage output signal from input section 803, are connected to each output section 802a-n and are connected to current sources 811b,c, respectively, to boost the bias current when multiple output sections 802a-n are biased on for active operation. This allows a single broadband input signal 831 received at input ports 807a,b to be split for multiple different modifications without over biasing input section 803. For example, output section 802a can have its gain and phase modified and reconfigured to function as a mixer, output section 802b can function as an amplifier, output section 802c can function as an amplifier, and output section 802n could be off or isolated and output substantially no RF energy.

Figure 9:
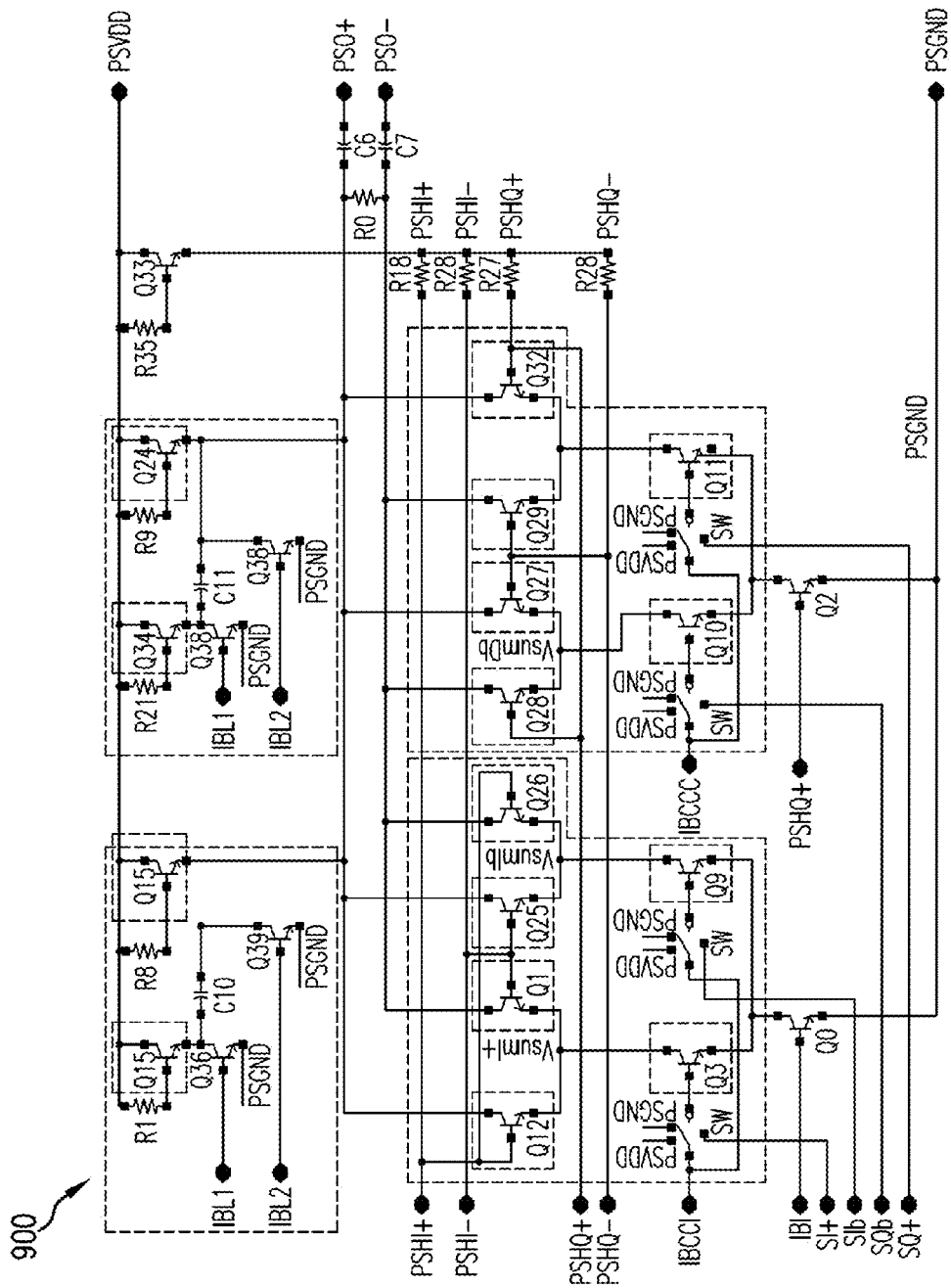
FIG. 9 is a schematic diagram of an exemplary phase shifter combinable to the multi-mode circuit of FIG. 8 in the active splitter of the reconfigurable filter of FIG. 1.

A local oscillation (LO) signal 835 can be provided at input ports 816a,b for up-converting or down-converting the input signal 831 in output section 802 driven as a mixer. VGA buffers 827a-n independently drive bias sections 804a-n, respectively, by supplying or isolating LO signal 835. A high input impedance of VGA buffers 827a-n allows the parallel combination of VGA buffers 827a-n to remain high regardless of the state of each VGA buffers 827a-n. This enables any given output section 802a-n to be turned off or switched to any mode and gain setting without impacting the input impedance at input ports 816a,b, and also isolate LO signal 835 from output sections 802a-n that do not need any LO energy. Output ports 838 a,b of output section 802a-n supply an output signal 833a-n to a vector modulator to obtain the quadrature signals (I/Q component signals) from the differential signals then to a phase shifter 900, as shown in FIG. 9. Phase shifter 900 is generally configured to receive components of an input signal (e.g., the input signal's I and Q components of output signals 833a-n, respectively) and to output a phase-shifted combination of the input signal's components. An exemplary phase shifter 900 is discussed in more detail in U.S. non-provisional patent application titled, "ULTRA-PRECISION LINEAR PHASE SHIFTER WITH GAIN CONTROL," Ser. No. 13/714,209, filed on Dec. 13, 2012, the contents of which are hereby incorporated by reference in its entirety.

Active combiner 118, which can have similar circuitry as active splitter 110, is operable for modifying the gain with and phase for each of the signals on paths 112a, 112b, and 112c, respectively, and recombining the signals into a composite filtered signal.

Figure 10:
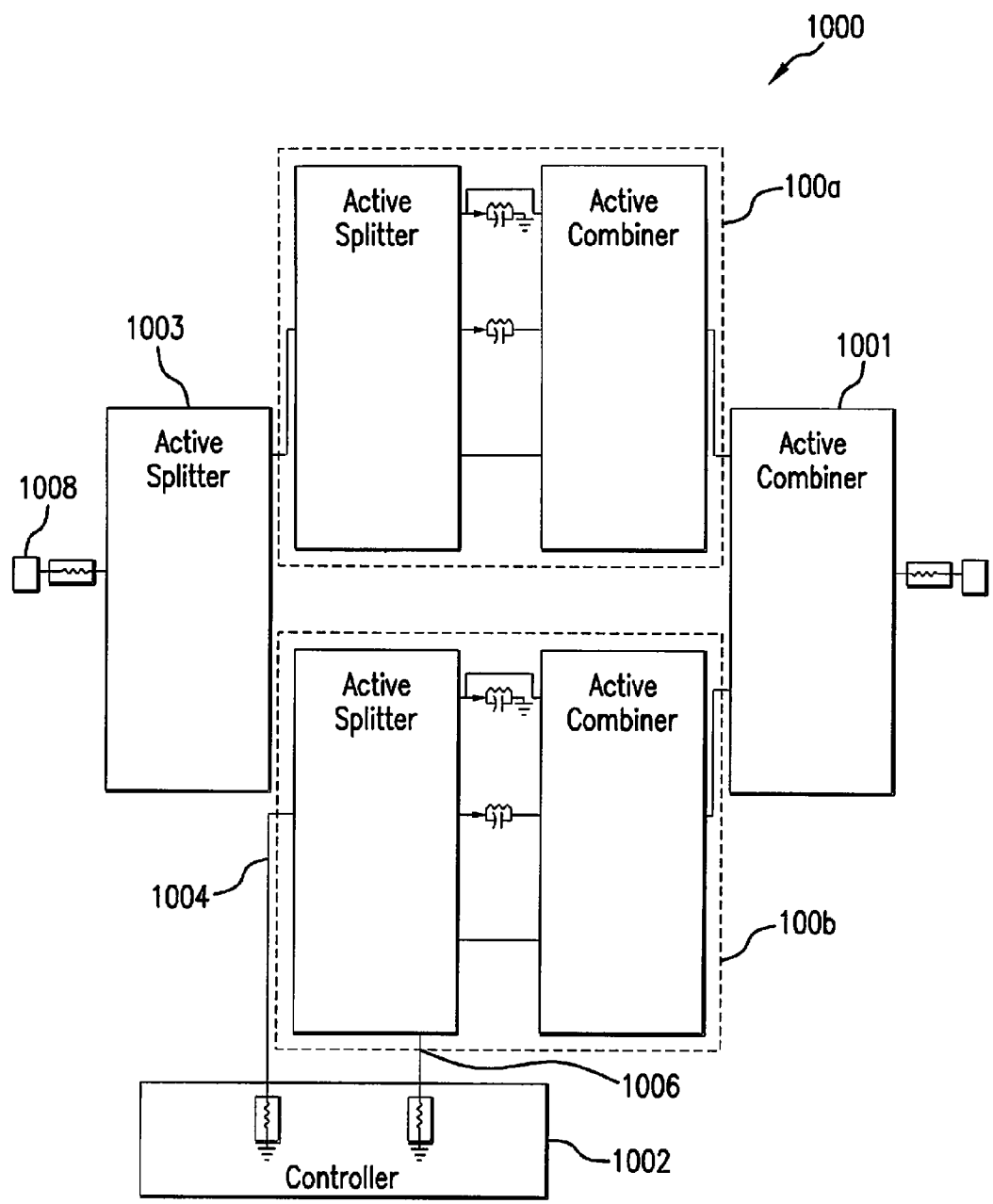
FIG. 10 is a block diagram of a multiple parallel reconfigurable filter of FIG. 1 combined to provide an active cancelling system.

FIG. 10 shows a block diagram of two reconfigurable filters 100 combined to an active splitter and active combiner 1001 to provide an active cancelling system 1000. Active cancelling system 1000, which may or may not include a controller 1002, can receive a specific signal and up-convert or amplify it to a desired frequency then summed with another signal to cancel an undesired component. This is particularly advantageous when there is an undesired signal, which can be a high-power jamming signal near a signal of interest. The high-power jamming signal can interfere and effectively hide the signal of interest. Active cancelling system 1000 can receive a synthesized signal with an amplitude and phase properly aligned, so that when the synthesized signal is combined with jamming signal, the jamming signal is effectively cancelled, leaving the desired signal substantially untouched.

A controller 1002 connected to filter 100b provides a synthesized signal at input port 1004. An LO signal provided from controller 1002 at LO port 1006 is used for up-converting the synthesized signal to the appropriate frequency of the jamming signal. Alternatively, the synthesized signal could be generated at the frequency of the jamming signal, in which case reconfigurable filter 100 can be used as an amplifier and phase shifter to for amplifying and phase-shifting the synthesized signal to adjust the gain and phase accordingly. An input signal, which can be an antenna signal, which includes the signal of interest and the jamming signal, is provided at input port 1008 to an active splitter 1003. In an embodiment, active combiner 1001 phase-shifts the synthesized signal with respect to the signal of interest. The phase and gain can also be adjusted by one or both of reconfigurable filters 100a, 100b. The synthesized signal and the antenna signal are combined together by active combiner 1001 to cancel the jamming signal.

Figure 11:
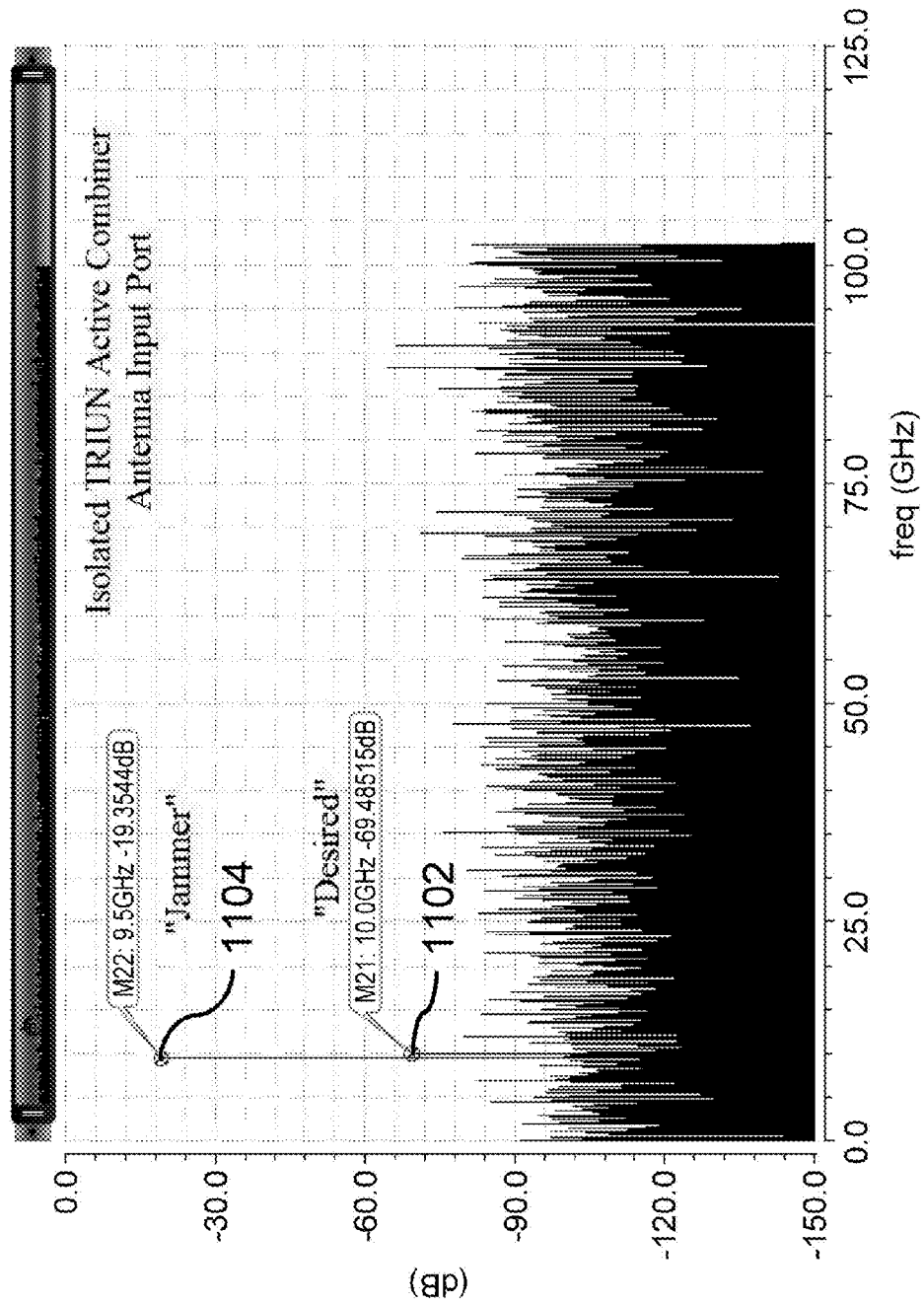
FIG. 11 shows an antenna signal including a signal of interest and a jamming signal.
Figure 12:
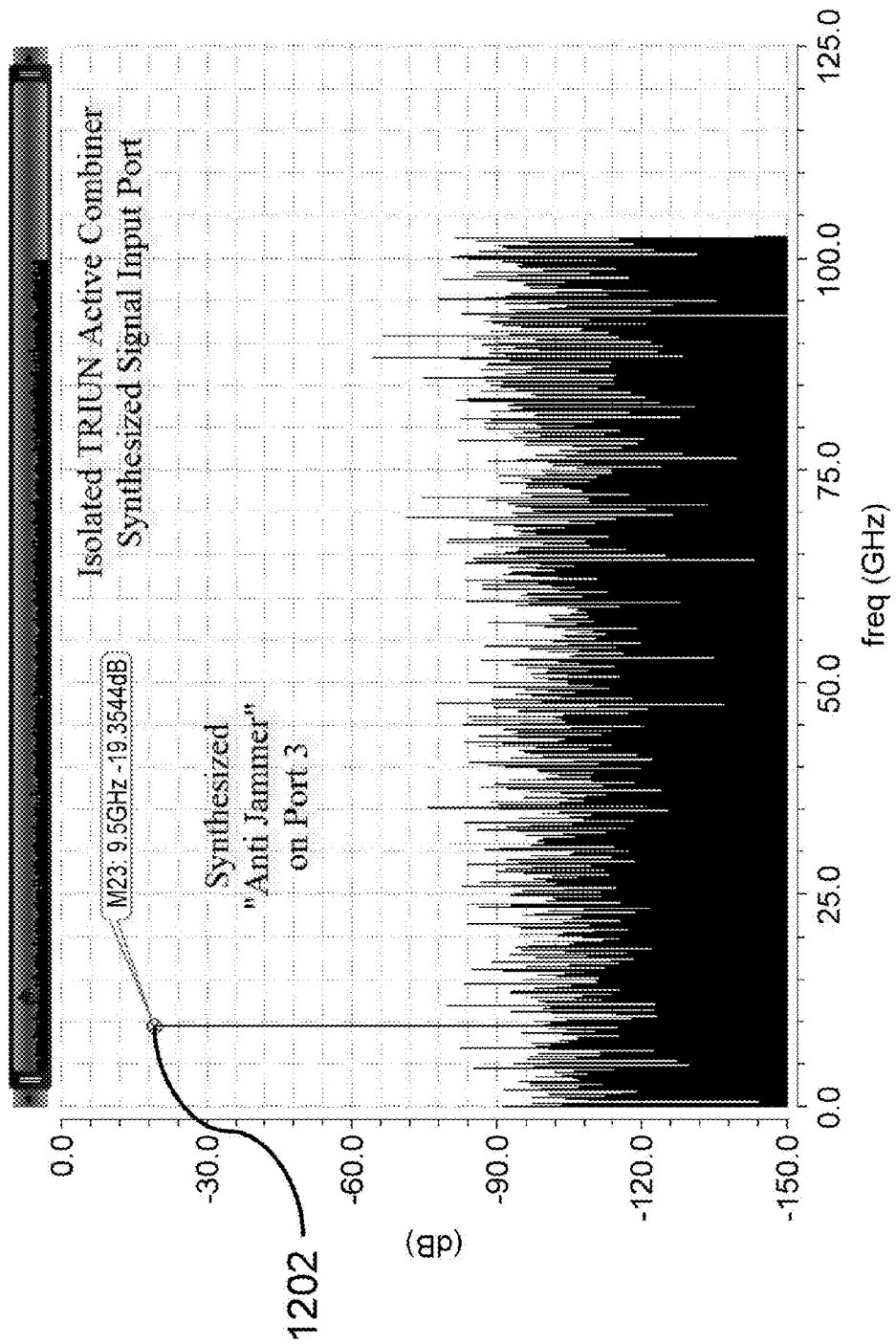
FIG. 12 shows a synthesized signal corresponding to the same frequency but out of phase with the jamming signal of FIG. 11.
Figure 13:
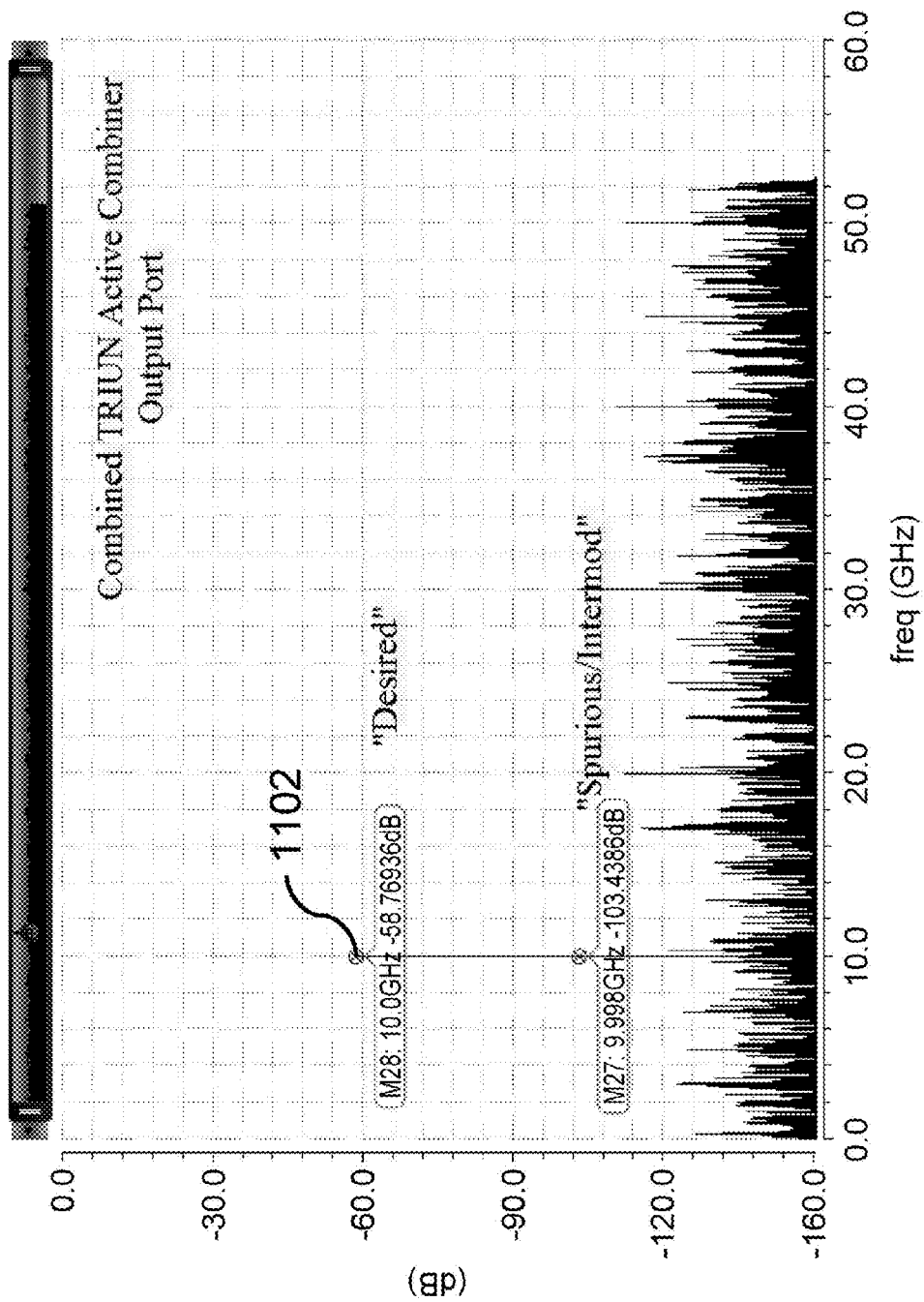
FIG. 13 shows a composite signal comprising the antenna signal of FIG. 11 combined with the synthesized signal of FIG. 12 by the active cancelling system of FIG. 10.

FIG. 11 shows the antenna signal at input port 1008 to active splitter 1003 of active cancelling system 1000. The antenna signal includes a signal of interest 1102 near a jamming signal 1104. The high power of jamming signal 1104 could conceal the signal of interest 1102 from a dynamic range perspective. FIG. 12 shows a synthesized signal 1202 at the same frequency as jamming signal 1104 but with amplitude and phase adjusted by reconfigurable filter 100b so that the amplitudes of jamming signal 1104 and signal of interest 1102 are equal but 180 degrees out of phase. When the antennas signal of FIG. 11 and synthesized signal 1202 of FIG. 12 are combined by active combiner 1001, the resulting output is shown in FIG. 13 with signal of interest 1102 being the dominant signal.

The foregoing is one exemplary demonstration of the utility of filter 100. Numerous other filtering applications are contemplated by this disclosure due to the versatility of filter 100. Virtually any type of filter with an infinite variety of frequency responses can be programmed by reconfigurable filter 100 when combined in various parallel and series combinations. For example, FIG. 14 shows a block diagram of two parallel filters 100c and 100d combined between an active splitter 1402 and an active combiner 1404 to provide a complex frequency response.

Figure 14:
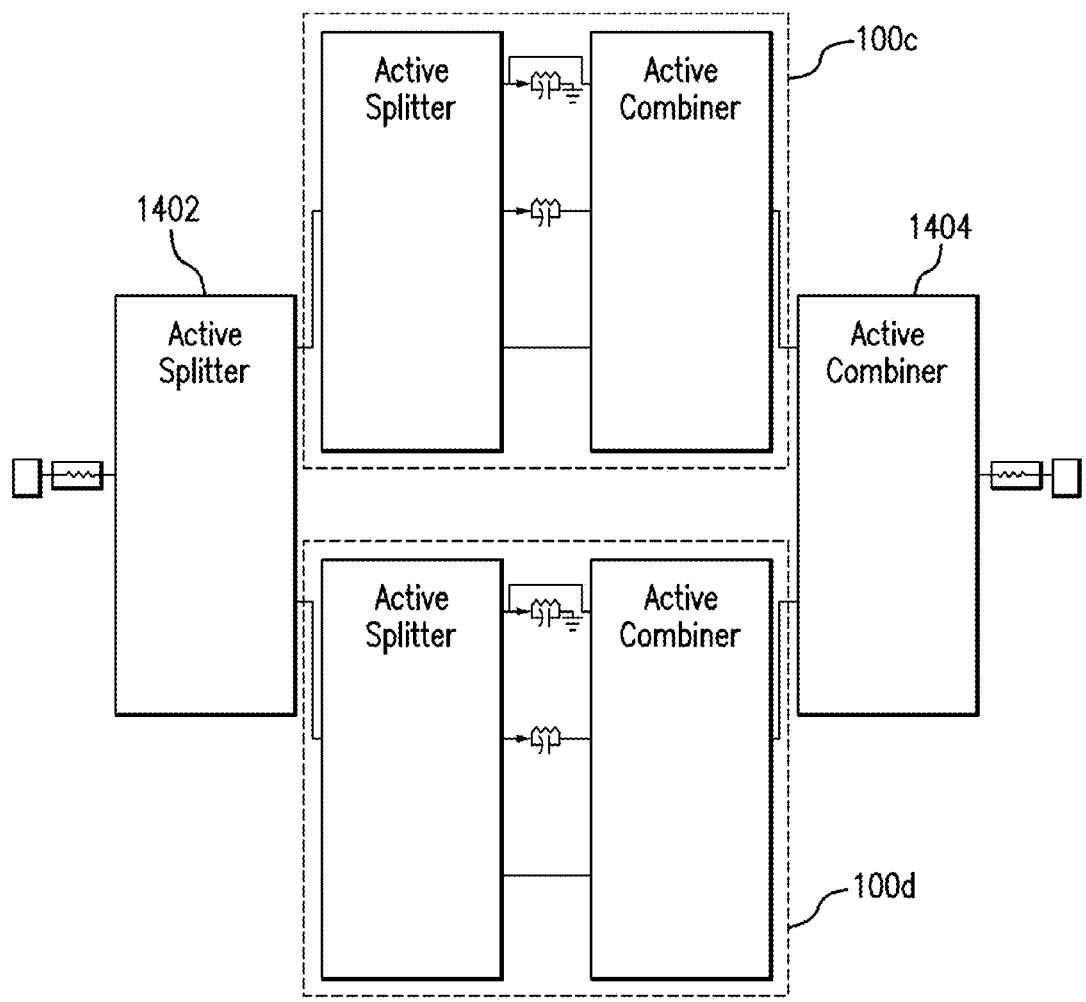
FIG. 14 shows a block diagram of a multiple parallel reconfigurable filter of FIG. 1 combined to provide increasingly complex frequency shaping response capability.
Figure 15:
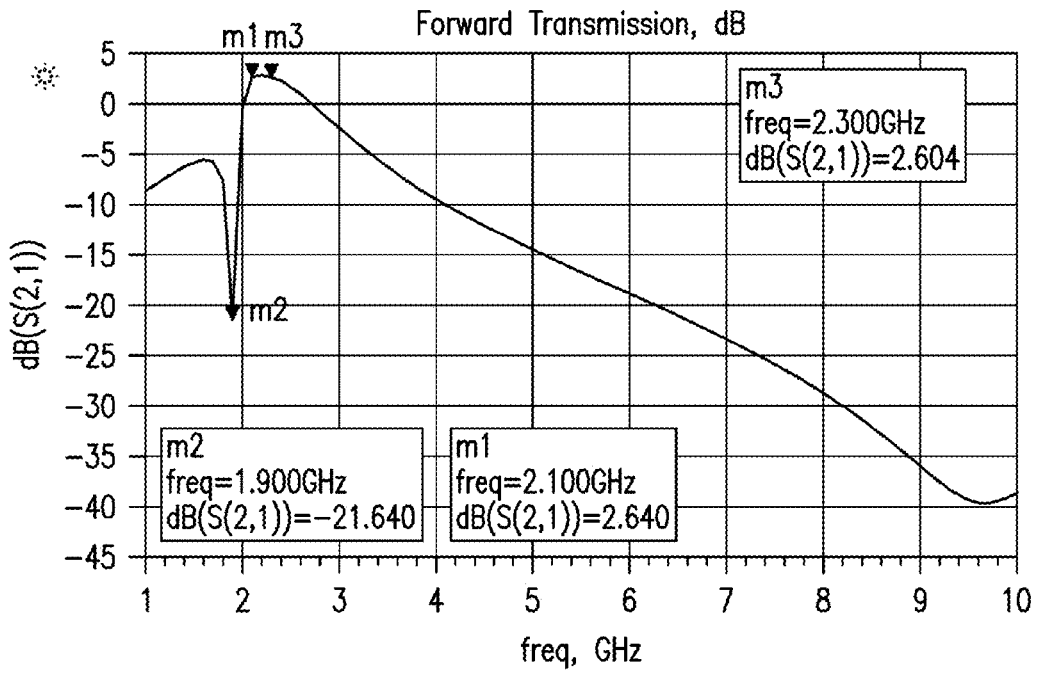
FIG. 15 shows the frequency response of the reconfigurable filter of FIG. 1 configured to produce a band pass with a sharp notch.

FIG. 15 shows the response of a lower center frequency band pass response of reconfigurable filter 100d of FIG. 14 than is capable of a single reconfigurable filter 100c. Reconfigurable filter 100c can be optimized for higher frequencies, which allows reconfigurable filter 100d to be configured to have a sharp notch tuned near the low side of the pass band.

Figure 16:
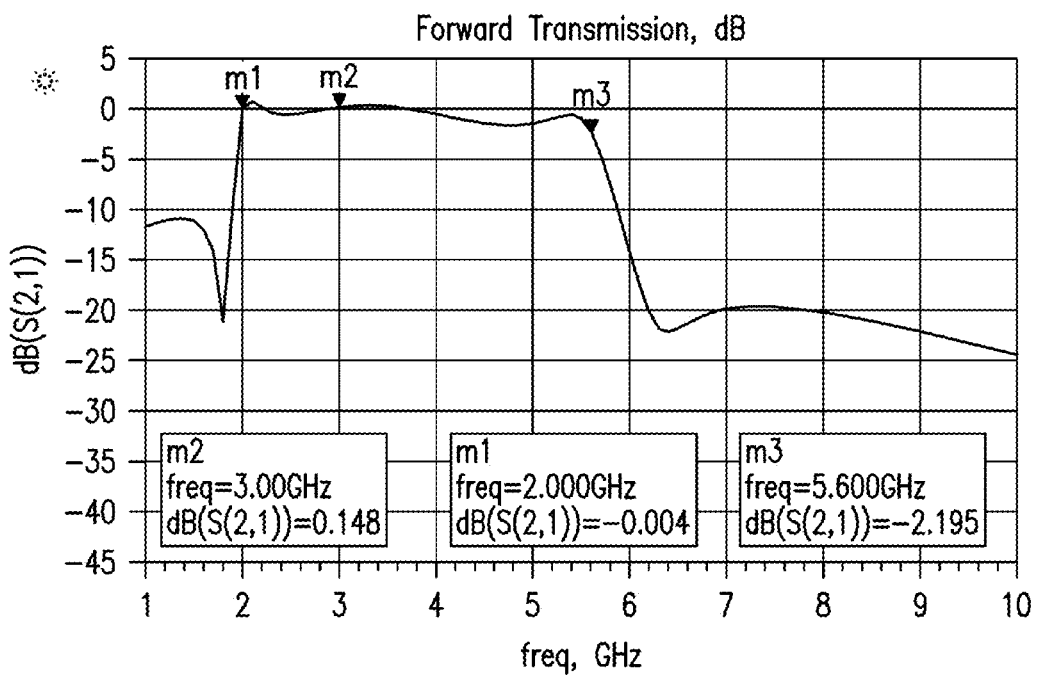
FIG. 16 shows the frequency response of the reconfigurable filter of FIG. 1 configured to produce a very broad pass band.

FIG. 16 shows the response of a very broad pass band response created by combing reconfigurable filter 100c and reconfigurable filter 100d together, which is broader than either can do by themselves while maintaining the same sharp notch near the low end of the response.

Reference has been made to several components throughout this disclosure as though each component is a unique component. One skilled in the art will readily recognize, however, that the various systems, circuits, and devices can be incorporated into one or more other systems, circuits, and devices thereby reducing the number of components, or various systems and circuits can be reduced to any other arrangement of systems, circuits, and devices. For example, active splitter 110 can be separated into a splitter, one or more amplifiers, and one or more phase shifters. One skilled in the art will also recognize that the circuits and methods disclosed herein can be adapted to virtually any signal modification system at any useable frequency range or bandwidth. However, the foregoing is particularly useful in high bandwidth applications on the order of 10 MHz to 100 GHz, and any range therebetween.

While the present invention has been particularly shown and described with reference to exemplary embodiments thereof, it should be understood by those of ordinary skill in the art that various changes, substitutions and alterations can be made herein without departing from the scope of the invention as defined by the appended claims and their equivalents.

What is claimed is:

1. A reconfigurable filter comprising:
    a splitter for receiving an input signal and dividing the input signal into a plurality of signals and respectively providing the plurality of signals to a corresponding path of a plurality of paths;
    a first filter section connected to a first path of the plurality of paths for providing a first filtered signal, wherein the first filter section is operably responsive to a first control signal to change a frequency response of the first filter section, wherein the first filter section is a tunable band pass filter responsive to the first control signal;
    an all pass section connected in parallel with the first filter section and connected to a second path of the plurality of paths for providing an unfiltered signal; a second filter section connected to a third path of the plurality of paths for providing a second filter signal, wherein the second filter section is operably responsive to a second control signal to change a frequency response of the second filter section, wherein the second filter section is a tunable notch filter; and
    a combiner for combining the first filtered signal, the second filter signal, and the unfiltered signal for producing a composite filtered signal.

2. The reconfigurable filter of claim 1, wherein the second path between the splitter and the combiner is uninterrupted.

3. The reconfigurable filter of claim 1, wherein the combiner is operable to shift a phase of the first filtered signal from the first filter section.

4. The reconfigurable filter of claim 1, wherein the combiner is operable to shift a phase of the second filtered signal from the second filter section.

5. The reconfigurable filter of claim 1, wherein the tunable band pass filter includes a shunt-connected fixed inductor connected in parallel with a tunable varactor responsive to the first control signal, and the tunable notch filter includes a fixed inductor connected in parallel with another tunable varactor responsive to the second control signal.

6. The reconfigurable filter of claim 5, wherein the splitter is operable to shift a phase of the input signal before the combiner combines the unfiltered signal from the all pass section with the first filtered signal and the second filtered signal to produce the composite filtered signal.

7. A method for cancelling a signal comprising:
receiving an input signal including a signal of interest and an undesired signal;
creating a synthesized signal;
providing a reconfigurable filter for receiving the synthesized signal;
configuring a multi-mode circuit in an active splitter of the reconfigurable filter as a mixer for up-converting the synthesized signal to a frequency of the undesired signal;
phase-shifting the synthesized signal with respect to the undesired signal; and
combining the synthesized signal with the input signal to substantially cancel the undesired signal with respect to the signal of interest.

8. The method of claim 7, and further comprising configuring an active combiner in the reconfigurable filter for phase-shifting the synthesized signal with respect to the undesired signal.

9. The method of claim 8, and further comprising aligning an amplitude and a phase of the synthesized signal with the undesired signal, and providing an active combiner for combining the synthesized signal with the input signal to substantially cancel the undesired signal with respect to the signal of interest.

10. A reconfigurable filter comprising:
a splitter for receiving an input signal and dividing the input signal into first and second signals and providing the first signal to a first path and the second signal to a second path;
a first filter section connected to the first path and providing a first filtered signal; and
a combiner for producing a composite filtered signal, wherein the splitter divides the input signal into the first signal, the second signal, and a third signal and provides the third signal to a third path, and the filter further comprises a second filter section connected to the third path in parallel with the first filter section and the first path for providing a second filtered signal, and wherein the splitter modifies an amplitude and phase of one of the first signal, second signal, and third signal before providing the one of the first signal, second signal, and third signal to the corresponding path and the combiner combines the second signal on the second path with the first filtered signal and the second filtered signal to produce the composite filtered signal.

11. The reconfigurable filter of claim 10, wherein the second path between the splitter and the combiner is uninterrupted.

12. The reconfigurable filter of claim 10, wherein the combiner is operable to shift a phase of the second signal on the second path before the combiner combines the second signal on the second path with the first filtered signal to produce the composite filtered signal.

13. The reconfigurable filter of claim 10, wherein the first filter section is operably responsive to a first control signal to change a frequency response of the first filter section, and the second filter section is operably responsive to a second control signal to change a frequency response of the second filter section.

14. The reconfigurable filter of claim 13, wherein the first filter section is a tunable band pass filter responsive to the first control signal and the second filter section is a tunable notch filter.

15. The reconfigurable filter of claim 14, wherein the tunable band pass filter includes a shunt-connected fixed inductor combined in parallel with a tunable varactor responsive to the first control signal, and the tunable notch filter includes a fixed inductor combined in parallel with another tunable varactor responsive to the second control signal.

* * * * *